(12) United States Patent
Lin et al.

(10) Patent No.: US 9,711,488 B2
(45) Date of Patent: Jul. 18, 2017

(54) SEMICONDUCTOR PACKAGE ASSEMBLY

(71) Applicant: MediaTek Inc., Hsin-Chu (TW)

(72) Inventors: Tzu-Hung Lin, Zhubei (TW);
Ching-Wen Hsiao, Hsinchu (TW);
I-Hsuan Peng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/014,604

(22) Filed: Feb. 3, 2016

(65) Prior Publication Data
US 2016/0268234 A1    Sep. 15, 2016

Related U.S. Application Data

(60) Provisional application No. 62/132,677, filed on Mar. 13, 2015.

(51) Int. Cl.
*H01L 23/538* (2006.01)
*H01L 23/053* (2006.01)
*H01L 21/30* (2006.01)
*H01L 25/065* (2006.01)
(Continued)

(52) U.S. Cl.
CPC .......... *H01L 25/0657* (2013.01); *H01L 24/19* (2013.01); *H01L 25/16* (2013.01); *H01L 24/13* (2013.01); *H01L 24/16* (2013.01); *H01L 24/32* (2013.01); *H01L 24/73* (2013.01); *H01L 2224/04105* (2013.01); *H01L 2224/12105* (2013.01); *H01L 2224/131* (2013.01); *H01L 2224/13147* (2013.01); *H01L 2224/16227* (2013.01); *H01L 2224/16265* (2013.01); *H01L 2224/32265* (2013.01); *H01L 2224/73204* (2013.01); *H01L 2224/73209* (2013.01); *H01L 2224/92133* (2013.01); *H01L 2225/06513* (2013.01); *H01L 2225/06558* (2013.01); *H01L 2225/06586* (2013.01); *H01L 2924/1431* (2013.01); *H01L 2924/1432* (2013.01); *H01L 2924/1436* (2013.01);
(Continued)

(58) Field of Classification Search
CPC ..... H01L 25/0657; H01L 25/16; H01L 24/19; H01L 23/5385; H01L 23/5389; H01L 21/568; H01L 2225/06558; H01L 2225/06513; H01L 2225/06586
USPC ........ 257/686, 698, 700, 737, 738, E23.123, 257/E23.169, E23.174; 361/814
See application file for complete search history.

(56) References Cited

U.S. PATENT DOCUMENTS 6,952,049 B1 * 10/2005 Ogawa ................... H01G 4/232
257/678
7,115,931 B2 * 10/2006 Yamasaki .......... H01L 21/6835
257/296
(Continued)

*Primary Examiner* — Dao H Nguyen
(74) *Attorney, Agent, or Firm* — McClure, Qualey & Rodack, LLP

(57) ABSTRACT

The invention provides a semiconductor package assembly. The semiconductor package assembly includes a semiconductor die. A first molding compound covers a back surface of the semiconductor die. A redistribution layer (RDL) structure is disposed on a front surface of the semiconductor die. The semiconductor die is coupled to the RDL structure. A second molding compound is disposed on the front surface of the semiconductor die and embedded in the RDL structure. A passive device is disposed on the second molding compound and coupled to the semiconductor die.

23 Claims, 4 Drawing Sheets

(51) Int. Cl.
*H01L 25/16* (2006.01)
*H01L 23/00* (2006.01)

(52) U.S. Cl.
CPC ............... *H01L 2924/19011* (2013.01); *H01L 2924/19041* (2013.01); *H01L 2924/19104* (2013.01)

(56) References Cited

U.S. PATENT DOCUMENTS

| | | | | |
|---|---|---|---|---|
| 8,865,521 | B2 * | 10/2014 | Jeng | H01L 23/13 257/686 |
| 9,087,835 | B2 * | 7/2015 | Sutardja | H01L 23/49822 |
| 2010/0314749 | A1 * | 12/2010 | Kurita | H01L 21/563 257/698 |
| 2011/0031634 | A1 | 2/2011 | Pagaila | |
| 2011/0254160 | A1 * | 10/2011 | Tsai | H01L 21/486 257/738 |
| 2011/0285005 | A1 * | 11/2011 | Lin | H01L 21/4846 257/686 |
| 2014/0185264 | A1 * | 7/2014 | Chen | H01L 23/3128 361/814 |

* cited by examiner

SEMICONDUCTOR PACKAGE ASSEMBLY

CROSS REFERENCE TO RELATED APPLICATIONS

This application claims the benefit of U.S. Provisional Application No. 62/132,677 filed Mar. 13, 2015, the entirety of which is incorporated by reference herein.

BACKGROUND OF THE INVENTION

Field of the Invention

The present invention relates to a semiconductor package assembly, and in particular to a semiconductor package assembly with a passive device.

Description of the Related Art

In order to ensure miniaturization and multi-functionality of electronic products and communication devices, it is desired that semiconductor packages be small in size, to support multi-pin connection, high speeds, and high functionality. The multi-functional semiconductor package usually requires that passive devices be integrated therein. However, in a conventional semiconductor package, it is hard to provide additional area for the passive devices mounted thereon.

Thus, a novel semiconductor package assembly is desirable.

BRIEF SUMMARY OF THE INVENTION

A semiconductor package assembly is provided. An exemplary embodiment of a semiconductor package assembly includes a semiconductor die. A first molding compound covers a back surface of the semiconductor die. A redistribution layer (RDL) structure is disposed on a front surface of the semiconductor die. The semiconductor die is coupled to the RDL structure. A second molding compound is disposed on the front surface of the semiconductor die and embedded in the RDL structure. A passive device is disposed on the second molding compound and coupled to the semiconductor die.

Another exemplary embodiment of a semiconductor package assembly includes a semiconductor die. A first molding compound is disposed on a first surface of the semiconductor die. A redistribution layer (RDL) structure is disposed on a second surface opposite the first surface of the semiconductor die. A second molding compound is disposed on the second surface of the semiconductor die and embedded in the redistribution layer (RDL) structure. The second molding compound is separated from the first molding compound through the redistribution layer (RDL) structure. A passive device is disposed on the second molding compound and coupled to the semiconductor die.

Yet another exemplary embodiment of a semiconductor package assembly includes a semiconductor die. A first molding compound is in contact with a first surface of the semiconductor die. A redistribution layer (RDL) structure covers a first portion of a second surface opposite the first surface of the semiconductor die. A second molding compound covers a second portion of the second surface of the semiconductor die and embedded in the RDL structure. A passive device covers the second portion of the second surface of the semiconductor die. The second molding compound is disposed between the semiconductor die and the passive device.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
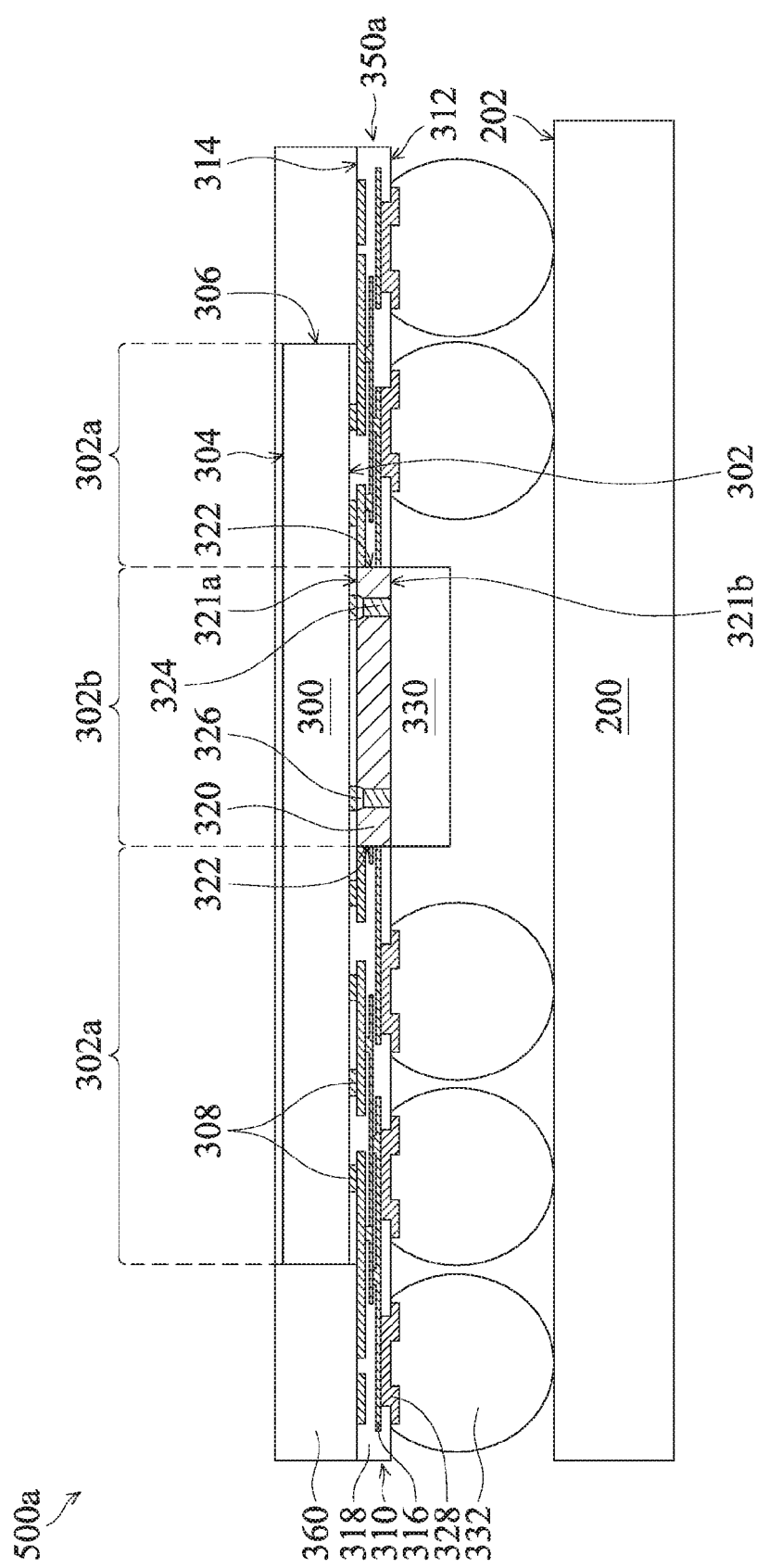
FIGS. 1-4 are cross-sectional views of a semiconductor package assembly in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and are not drawn to scale. The dimensions and the relative dimensions do not correspond to actual dimensions in the practice of the invention.

FIG. 1 is a cross-sectional view of a semiconductor package assembly 500a in accordance with some embodiments of the disclosure. In some embodiments, the semiconductor package assembly 500a is a wafer-level semiconductor package assembly, for example, a flip-chip semiconductor package assembly. To clearly show the arrangement of a passive device and conductive structures of the semiconductor package assembly, the size of the passive device and the size of conductive structures are enlarged.

As shown in FIG. 1, the semiconductor package assembly 500a includes at least one wafer-level semiconductor package 350a mounted on a base 200. In this embodiment, the wafer-level semiconductor package 350a includes a system-on-chip (SOC) package.

As shown in FIG. 1, the base 200, for example a printed circuit board (PCB), may be formed of polypropylene (PP). It should also be noted that the base 200 can be a single layer or a multilayer structure. A plurality of pads (not shown) and/or conductive traces (not shown) is disposed on a die-attach surface 202 of the base 200. In one embodiment, the conductive traces may comprise power segments, signal trace segments or ground trace segments, which are used for the input/output (I/O) connections of the wafer-level semiconductor package 350a. Also, the wafer-level semiconductor package 350a is mounted directly on the conductive traces. In some other embodiments, the pads are disposed on the die-attach surface 202, connected to different terminals of the conductive traces. The pads are used for the wafer-level semiconductor package 350a mounted directly thereon.

As shown in FIG. 1, the wafer-level semiconductor package 350a is mounted on the die-attach surface 202 of the base 200 by a bonding process. The wafer-level semiconductor package 350a is mounted on the base 200 through the conductive structures 332. The wafer-level semiconductor package 350a includes a semiconductor die 300 and a redistribution layer (RDL) structure 310. The semiconductor die 300, for example, a system-on-chip (SOC) die, may include a logic die including a central processing unit (CPU), a graphics processing unit (GPU), a dynamic random access memory (DRAM) controller or any combination thereof.

As shown in FIG. 1A, pads 308 of the semiconductor die 300 are disposed on the front surface 302 to be electrically connected to the circuitry (not shown) of the semiconductor die 300. In some embodiments, the pads 308 belong to the uppermost metal layer of the interconnection structure (not shown) of the semiconductor die 300. The pads 308 of the semiconductor die 300. It should be noted that the number of semiconductor dies 300 integrated in the semiconductor package assembly 500a is not limited to that disclosed in the embodiment.

As shown in FIG. 1, the wafer-level semiconductor package 350a further includes a first molding compound 360 covering and surrounding the semiconductor die 300. The first molding compound 360 is disposed on and in contact with a back surface 304 and sidewall surface 306 of the semiconductor die 300. In some embodiments, the first molding compound 360 may be formed of a nonconductive material, such as an epoxy, a resin, a moldable polymer, or the like. The first molding compound 360 may be applied while substantially liquid, and then may be cured through a chemical reaction, such as in an epoxy or resin. In some other embodiments, the first molding compound 360 may be an ultraviolet (UV) or thermally cured polymer applied as a gel or malleable solid capable of being disposed around the semiconductor die 300, and then may be cured through a UV or thermal curing process. The first molding compound 360 may be cured with a mold (not shown). In some other embodiments, the first molding compound 360 may be replaced by underfill layer.

As shown in FIG. 1, the wafer-level semiconductor package 350a further includes a redistribution layer (RDL) structure 310 disposed on the front surface 302 of the semiconductor die 300. The RDL structure 310 has opposite surfaces 312 and 314. Also, the RDL structure 310 may have one or more conductive traces 316 disposed in one or more inter-metal dielectric (IMD) layers 318. The semiconductor die 300 is connected to the conductive traces 316 close to the central portion of the surface 314. The first molding compound 360 covers the surface 314 of the RDL structure 310. Also, the first molding compound 360 is in contact with the periphery portion of the surface 314, which surrounds the central portion of the surface 314. However, it should be noted that the number of conductive traces 316 and the number of IMD layers 318 of the RDL structure 310 shown in FIG. 1 is only an example and is not a limitation to the present invention.

As shown in FIG. 1, the wafer-level semiconductor package 350a further includes conductive structures 332 disposed on the surface 312 of the RDL structure 310, which is away from the semiconductor die 300. The conductive structures 332 are coupled to the conductive traces 316 through pads 328, which is disposed on the conductive traces 316 and close to the surface 312. Also, the conductive structures 332 are separated from the first molding compound 360 through the RDL structure 310. In other words, the conductive structures 332 are free from in contact with the first molding compound 360. In some embodiments, the conductive structures 332 may comprise a conductive bump structure such as a copper bump or a solder bump structure, a conductive pillar structure, a conductive wire structure, or a conductive paste structure.

As shown in FIG. 1, the wafer-level semiconductor package 350a further includes a second molding compound 320 disposed on the front surface 302 of the semiconductor die 300. The molding compound 320 includes a surface 321a close to the semiconductor die 300 and a surface 321b opposite from the surface 321a. In some embodiments, the RDL structure 310 and the second molding compound 320 cover different respective portions of the front surface 302 of the semiconductor die 300. For example, the RDL structure 310 covers a portion 302a of the front surface 302 of the semiconductor die 300. The second molding compound 320 covers a portion 302b of the front surface 302 of the semiconductor die 300. The portion 302a is adjacent to the portion 302b. Also, the second molding compound 320 is embedded in the RDL structure 310. In some embodiments, a sidewall 322 of the second molding compound 320 is surrounded by the RDL structure 310. Also, the second molding compound 320 is separated from the first molding compound 360 through the semiconductor die 300 and the RDL structure 310. In some embodiments, the materials and the manufacturing processes of the second molding compound 320 may be similar to those of the first molding compound 360.

As shown in FIG. 1, the wafer-level semiconductor package 350a further includes a passive device 330, for example, a decoupling capacitor, disposed on the second molding compound 320. In some embodiments, the passive device 330 may comprise a passive device chip or a discrete passive device, for example, a multilayer ceramic chip capacitor (MLCC) device, or integrated passive device (IPD). In some embodiments, the passive device 330 and the conductive structures 332 are disposed close to the surface 312 of the RDL structure 310, which is away from the semiconductor die 300 as shown in FIG. 1. In this embodiment, an interface (i.e. the surface 321b of the second molding compound 320) between the passive device 330 and the second molding compound 320 is aligned to the surface 312 of the RDL structure 310, which is away from the semiconductor die 300.

In some embodiments, the passive device 330 is coupled to the semiconductor die 300 through conductive bumps 324 and solders 326 as shown in FIG. 1. The conductive bumps 324 are formed passing through the second molding compound 320. Also, the conductive bumps 324 are in contact with terminals (not shown) of the passive device 330. The solders 326 are disposed between and in contact with the corresponding conductive bumps 324 and the corresponding pads 308 of the semiconductor die 300. In some embodiments, the conductive bumps 324 and the solders 326 are surrounded by the second molding compound 320. Therefore, the conductive bumps 324 and the solders 326 are electrically isolated form the RDL structure 310 by the second molding compound 320. In some embodiments, the conductive bumps 324 may include copper bumps or copper pillars. In some embodiments, the passive device 330 is coupled to the semiconductor die 300 without using the conductive traces 316 of the RDL structure 310. Therefore, the length of the electrically conductive path between the passive device 330 and the semiconductor die 300 (i.e. the lengths of the conductive bump 324 and the corresponding solder 326 in this embodiment) can be reduced further to improve signal integrity/power integrity (SI/PI) performance of the of the of the semiconductor package assembly 500a.

In some embodiments, the thickness (height) of the passive device 330 is designed to be less than the diameter of the conductive structures 332 as shown in FIG. 1. The thin profile of the passive device 330 may facilitate processing the surface-mount technology (SMT) rework process for the conductive structures 332 of the wafer-level semiconductor package 350a.

Figure 2:
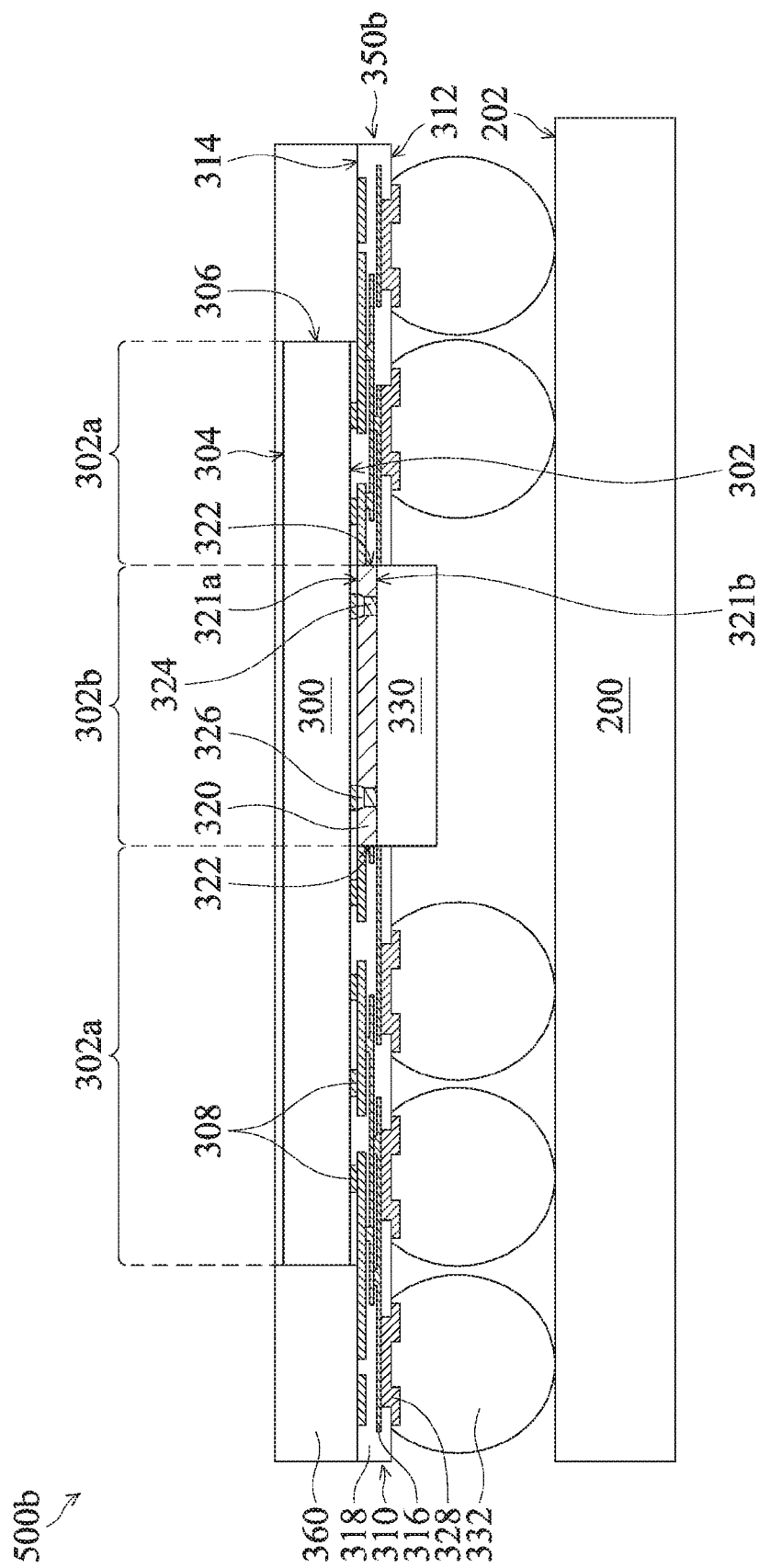

FIG. 2 is a cross-sectional view of a semiconductor package assembly 500b in accordance with some embodiments of the disclosure. Descriptions of elements of the embodiments hereinafter that are the same or similar as those previously described with reference to FIG. 1 are omitted for brevity.

As shown in FIG. 2, one of the differences between the semiconductor package assembly 500a shown in FIG. 1 and the semiconductor package assembly 500b is that a portion of the passive device 330 of the semiconductor package 350b is embedded in the RDL structure 310. In this embodiment, the interface (i.e. the surface 321b of the second molding compound 320) between the passive device 330 and the second molding compound 320 is between the opposite surfaces 312 and 314 of the RDL structure 310 of the wafer-level semiconductor package 350b of the semiconductor package assembly 500b.

In this embodiment, the thickness (height) the passive device 330 above the surface 312 of the RDL structure 310 is less than the diameter of the conductive structures 332 as shown in FIG. 2. The thin profile of the passive device 330 may facilitate processing the surface-mount technology (SMT) rework process for the conductive structures 332 of the wafer-level semiconductor package 350b.

Figure 3:
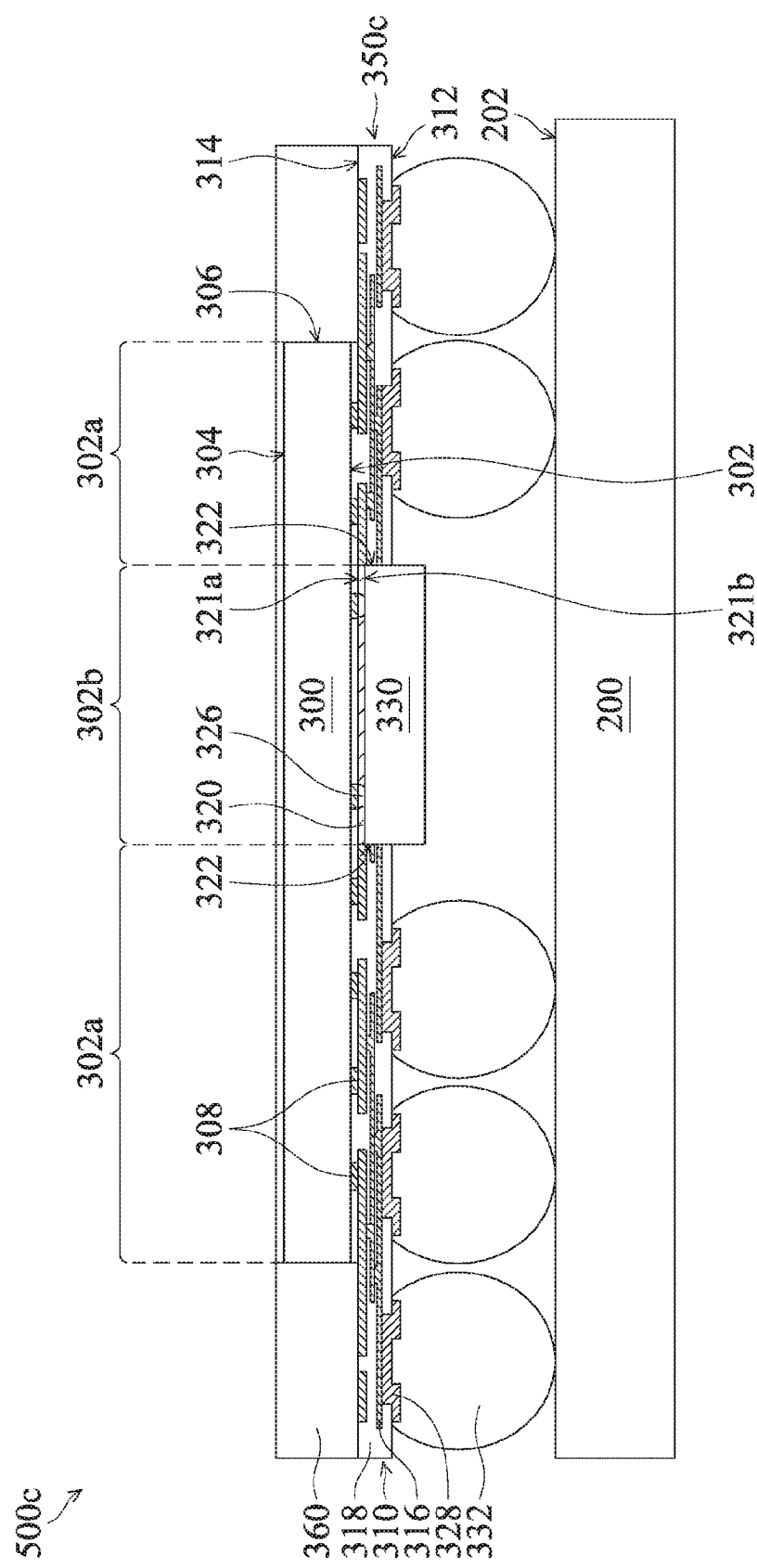

FIG. 3 is a cross-sectional view of a semiconductor package assembly 500c in accordance with some embodiments of the disclosure. Descriptions of elements of the embodiments hereinafter that are the same or similar as those previously described with reference to FIGS. 1-2 are omitted for brevity.

As shown in FIG. 3, one of the differences between the semiconductor package assembly 500a shown in FIG. 1 and the semiconductor package assembly 500c is that the passive device 330 of a semiconductor package 350c is coupled to the solders 326 without using any conductive bump. In other words, the semiconductor package 350c is in direct contact with the solders 326. In this embodiment, an interface (i.e. the position of the surface 321b of the second molding compound 320) between the passive device 330 and the second molding compound 320 is between the opposite surfaces 312 and 314 of the RDL structure 310 of the wafer-level semiconductor package 350c of the semiconductor package assembly 500c.

In this embodiment, the thickness (height) the passive device 330 above the surface 312 of the RDL structure 310 is much less than the diameter of the conductive structures 332 as shown in FIG. 3. The thin profile of the passive device 330 may facilitate processing the surface-mount technology (SMT) rework process for the conductive structures 332 of the wafer-level semiconductor package 350c.

Figure 4:
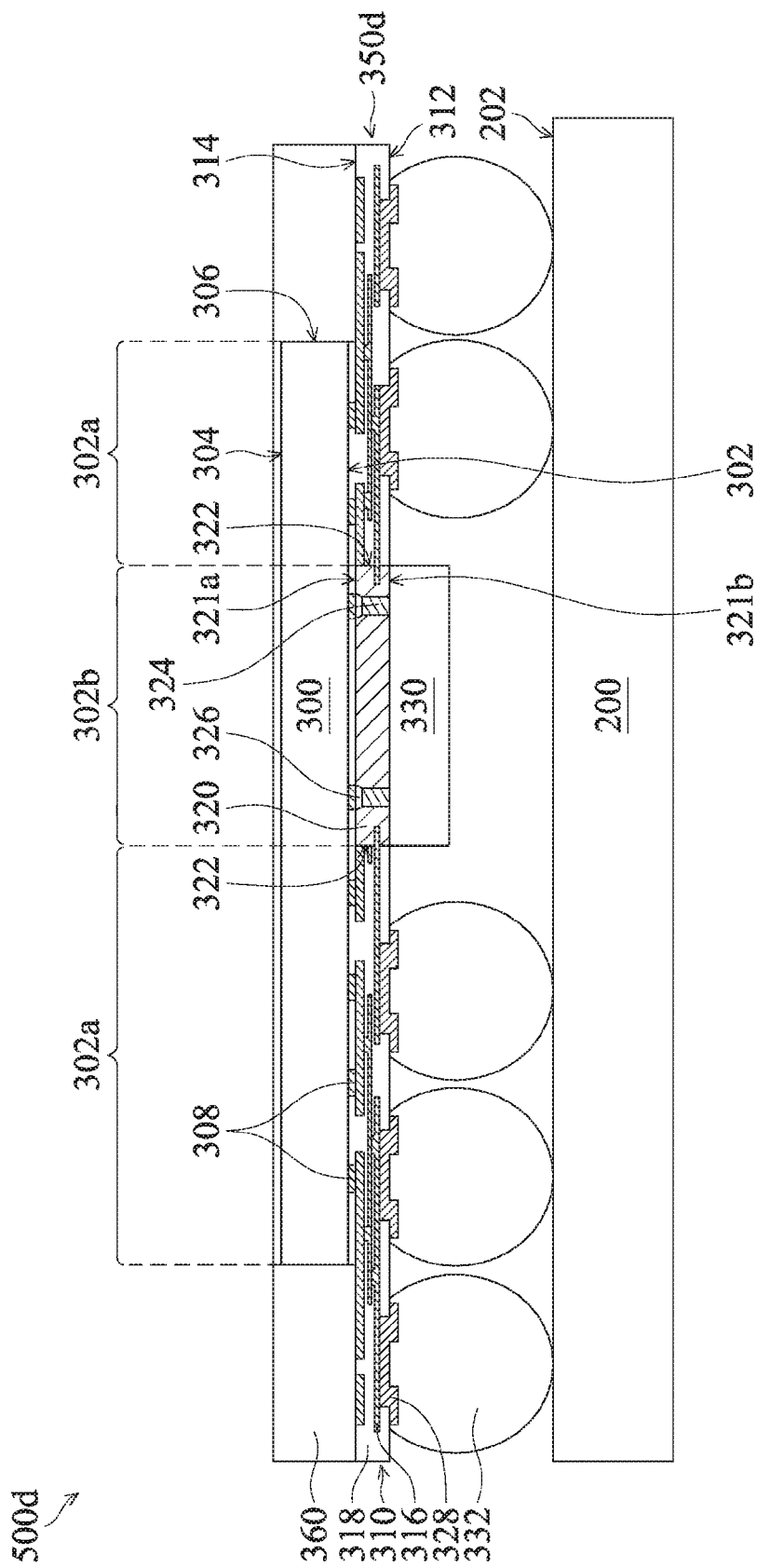

FIG. 4 is a cross-sectional view of a semiconductor package assembly 500d in accordance with some embodiments of the disclosure. Descriptions of elements of the embodiments hereinafter that are the same or similar as those previously described with reference to FIGS. 1-3 are omitted for brevity.

As shown in FIG. 4, one of the differences between the semiconductor package assembly 500a shown in FIG. 1 and the semiconductor package assembly 500d is that some of the conductive traces 316 of the RDL structure 310 may be formed extending into the second molding compound 320. It should be noted that the conductive traces 316 extended into the second molding compound 320 are electrically isolated from the conductive bumps 324 and the solders 326 through the second molding compound 320.

Embodiments provide a semiconductor package assembly. The semiconductor package assembly includes a wafer-level semiconductor package. The wafer-level semiconductor package includes a semiconductor die. A first molding compound covers a back surface of the semiconductor die. A redistribution layer (RDL) structure is disposed on a front surface of the semiconductor die. The semiconductor die is coupled to the RDL structure. A second molding compound is disposed on the front surface of the semiconductor die and embedded in the RDL structure. A passive device is disposed on the second molding compound and coupled to the semiconductor die. The passive device and conductive structures (e.g. solder ball or bump structures) are disposed close to a surface of the RDL structure, which is away from the semiconductor die. The passive device is coupled to the semiconductor die through conductive bumps passing through the second molding compound. Also, the RDL structure and the second molding compound cover different portions of the front surface of the semiconductor die, respectively. It should be noted that the passive device is coupled to the semiconductor die without using conductive traces of the RDL structure. Therefore, the length of the electrically conductive path between the passive device and the semiconductor die (i.e. the length of the conductive bump) can be reduced further to improve signal integrity/power integrity (SI/PI) performance of the of the semiconductor package assembly. Additionally, the thickness (height) of the passive device is designed to be less than the diameter of the conductive structures. The thin profile of the passive device may facilitate processing the surface-mount technology (SMT) rework process for the conductive structures of the wafer-level semiconductor package. In some other embodiments, the passive device of the wafer-level semiconductor package is designed to be embedded in a portion of the RDL structure to further reduce the distance between the passive device and the semiconductor die.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
   a semiconductor die;
   a first molding compound covering a back surface of the semiconductor die;
   a redistribution layer (RDL) structure disposed on a front surface of the semiconductor die, wherein the semiconductor die is coupled to the RDL structure;
   a second molding compound disposed on the front surface of the semiconductor die and embedded in the redistribution layer (RDL) structure;
   a passive device disposed on the second molding compound and coupled to the semiconductor die; and
   conductive structures disposed on a first surface of the redistribution layer (RDL) structure, the first surface facing away from the semiconductor die, wherein the conductive structures are coupled to the redistribution layer (RDL) structure, and a thickness of the passive device is less than a diameter of the conductive structures as viewed in vertical cross-section.

2. The semiconductor package assembly as claimed in claim 1, further comprising:
a conductive bump passing through the second molding compound, wherein the passive device is coupled to the semiconductor die through the conductive bump.

3. The semiconductor package assembly as claimed in claim 1, wherein a sidewall of the second molding compound is surrounded by the redistribution layer (RDL) structure.

4. The semiconductor package assembly as claimed in claim 1, wherein the first molding compound is separated from the second molding compound through the semiconductor die and the redistribution layer (RDL) structure.

5. The semiconductor package assembly as claimed in claim 1, wherein the passive device is embedded in the redistribution layer (RDL) structure.

6. The semiconductor package assembly as claimed in claim 1, wherein an interface between the passive device and the second molding compound is aligned to the first surface of the redistribution layer (RDL) structure.

7. The semiconductor package assembly as claimed in claim 6, wherein the redistribution layer (RDL) structure comprises conductive traces extended into the second molding compound.

8. The semiconductor package assembly as claimed in claim 1, wherein the second molding compound fills an opening, in which the passive device is disposed, in the redistribution layer (RDL) structure.

9. A semiconductor package assembly, comprising:
a semiconductor die;
a first molding compound disposed on a first surface of the semiconductor die;
a redistribution layer (RDL) structure disposed on a second surface opposite the first surface of the semiconductor die;
a second molding compound disposed on the second surface of the semiconductor die and embedded in the redistribution layer (RDL) structure, wherein the second molding compound is separated from the first molding compound through the redistribution layer (RDL) structure;
a passive device disposed on the second molding compound and coupled to the semiconductor die; and
conductive structures disposed on a first surface of the redistribution layer (RDL) structure, the first surface facing away from the semiconductor die, wherein the conductive structures are coupled to the redistribution layer (RDL) structure, and a thickness of the passive device is less than a diameter of the conductive structures as viewed in vertical cross-section.

10. The semiconductor package assembly as claimed in claim 9, wherein the redistribution layer (RDL) structure and the second molding compound cover different portions of the second surface of the semiconductor die.

11. The semiconductor package assembly as claimed in claim 9, further comprising:
a conductive bump passing through the second molding compound, wherein the passive device is coupled to the semiconductor die through the conductive bump.

12. The semiconductor package assembly as claimed in claim 9, wherein a sidewall of the second molding compound is surrounded by the redistribution layer (RDL) structure.

13. The semiconductor package assembly as claimed in claim 9, wherein the passive device is embedded in the redistribution layer (RDL) structure.

14. The semiconductor package assembly as claimed in claim 9, wherein an interface between the passive device and the second molding compound is aligned to the first surface of the redistribution layer (RDL) structure.

15. The semiconductor package assembly as claimed in claim 14, wherein the redistribution layer (RDL) structure comprises conductive traces extended into the second molding compound.

16. The semiconductor package assembly as claimed in claim 9, wherein the second molding compound fills an opening, in which the passive device is disposed, in the redistribution layer (RDL) structure.

17. A semiconductor package assembly, comprising:
a semiconductor die;
a first molding compound in contact with a first surface of the semiconductor die;
a redistribution layer (RDL) structure covering a first portion of a second surface opposite the first surface of the semiconductor die;
a second molding compound covering a second portion of the second surface of the semiconductor die and embedded in the RDL structure;
a passive device covering the second portion of the second surface of the semiconductor die, wherein the second molding compound is disposed between the semiconductor die and the passive device; and
conductive structures disposed on a first surface of the redistribution layer (RDL) structure, the first surface facing away from the semiconductor die, wherein the conductive structures are coupled to the redistribution layer (RDL) structure, and a thickness of the passive device is less than a diameter of the conductive structures as viewed in vertical cross-section.

18. The semiconductor package assembly as claimed in claim 17, wherein the second molding compound is separated from the first molding compound through the redistribution layer (RDL) structure.

19. The semiconductor package assembly as claimed in claim 17, further comprising:
a conductive bump passing through the second molding compound, wherein the passive device is coupled to the semiconductor die through the conductive bump.

20. The semiconductor package assembly as claimed in claim 17, wherein the passive device is embedded in the redistribution layer (RDL) structure.

21. The semiconductor package assembly as claimed in claim 17, wherein an interface between the passive device and the second molding compound is aligned to the first surface of the redistribution layer (RDL) structure.

22. The semiconductor package assembly as claimed in claim 21, wherein the redistribution layer (RDL) structure comprises conductive traces extended into the second molding compound.

23. The semiconductor package assembly as claimed in claim 17, wherein the second molding compound fills an opening, in which the passive device is disposed, in the redistribution layer (RDL) structure.

* * * * *